United States Patent
Yanagihara et al.

(10) Patent No.: US 10,414,976 B2
(45) Date of Patent: Sep. 17, 2019

(54) METHOD FOR PRODUCING FLUORESCENT MATERIAL, FLUORESCENT MATERIAL, AND LIGHT EMITTING DEVICE USING THE SAME

(71) Applicant: NICHIA CORPORATION, Anan-shi, Tokushima (JP)

(72) Inventors: Tadayoshi Yanagihara, Tokushima (JP); Kazuya Nishimata, Anan (JP); Shoji Hosokawa, Tokushima (JP)

(73) Assignee: NICHIA CORPORATION, Anan-shi (JP)

( * ) Notice: Subject to any disclaimer, the term of this patent is extended or adjusted under 35 U.S.C. 154(b) by 156 days.

(21) Appl. No.: 15/459,572

(22) Filed: Mar. 15, 2017

(65) Prior Publication Data
US 2017/0275531 A1    Sep. 28, 2017

(30) Foreign Application Priority Data
Mar. 28, 2016  (JP) ................................. 2016-063527
Dec. 19, 2016  (JP) ................................. 2016-245709

(51) Int. Cl.
*C09K 11/77*    (2006.01)
*H01L 33/50*    (2010.01)
*H01L 33/48*    (2010.01)

(52) U.S. Cl.
CPC ........ *C09K 11/7734* (2013.01); *H01L 33/504* (2013.01); *H01L 33/486* (2013.01); *H01L 2224/48091* (2013.01); *H01L 2224/48247* (2013.01); *H01L 2224/48257* (2013.01); *H01L 2224/73265* (2013.01); *H01L 2924/181* (2013.01)

(58) Field of Classification Search
CPC .......................... C09K 11/7734; H01L 33/504
See application file for complete search history.

(56) References Cited

U.S. PATENT DOCUMENTS

| | | | |
|---|---|---|---|
| 7,002,291 B2 * | 2/2006 | Ellens ................ | C09K 11/7734 252/301.4 P |
| 7,345,413 B2 * | 3/2008 | Braune ................ | C09K 11/025 313/486 |
| 2017/0130125 A1 | 5/2017 | Shibamoto et al. | |

FOREIGN PATENT DOCUMENTS

| | | |
|---|---|---|
| JP | 2003-535477 A | 11/2003 |
| JP | 2015-214705 A | 12/2015 |
| JP | 2016-027077 A | 2/2016 |
| WO | WO 01/93341 * | 12/2001 |
| WO | 2011-125452 A1 | 10/2011 |
| WO | 2012-070565 A1 | 5/2012 |

\* cited by examiner

*Primary Examiner* — C Melissa Koslow
(74) *Attorney, Agent, or Firm* — Hunton Andrews Kurth LLP

(57) ABSTRACT

A method of producing a fluorescent material that is capable of providing a light emitting device having excellent durability, a fluorescent material, and a light emitting device are provided. The method of producing the fluorescent material includes: preparing a calcined product having a chlorosilicate composition containing at least one element selected from the group consisting of Ca, Sr, and Ba, at least one element selected from the group consisting of Mg and Zn, at least one element selected from the group consisting of Eu, Ce, Tb, and Mn, Si, O, and Cl; and bringing the calcined product in contact with a fluorine-containing substance and heat-treating the calcined product in an inert gas atmosphere at a temperature in a range of 200° C. or more and 450° C. or less.

8 Claims, 8 Drawing Sheets

METHOD FOR PRODUCING FLUORESCENT MATERIAL, FLUORESCENT MATERIAL, AND LIGHT EMITTING DEVICE USING THE SAME

CROSS-REFERENCE TO RELATED APPLICATIONS

This application claims the benefit of Japanese Patent Application No. 2016-063527, filed on Mar. 28, 2016, and Japanese Patent Application No. 2016-245709, filed on Dec. 19, 2016, the disclosures of which are hereby incorporated by reference in their entirety.

BACKGROUND

Technical Field

The present disclosure relates to a method of producing a fluorescent material, a fluorescent material, and a light emitting device using the same.

Description of Related Art

A light emitting device has been developed that is capable of emitting light having a variety of hues based on the principle of color mixing of light by combining a light source with a wavelength conversion member capable of emitting light having a different hue from the hue of the light source through excitation with the light from the light source. In particular, a light emitting device having a combination of a light emitting diode (which may be hereinafter referred to as an "LED") and a fluorescent material is actively being applied to an illumination equipment, a backlight for a liquid crystal display device, a small sized strobe, and the like, and is being widely used. For example, the color reproducible range of the liquid crystal display device and the color rendering property of the illumination equipment can be improved by combining a fluorescent material that emits light having a short wavelength, such as blue green color, green color, and yellow green color, and a fluorescent material that emits light having a long wavelength, such as orange and red.

Japanese Unexamined Patent Publication No. 2003-535477 discloses a green light emitting fluorescent material using calcium magnesium chlorosilicate ($Ca_8Mg(SiO_4)_4Cl_2$) activated by Eu.

SUMMARY

A chlorosilicate fluorescent material has a high luminous efficiency, but has a tendency of deterioration in a high temperature and high humidity environment, and thus an improvement of the durability of the light emitting device using a chlorosilicate fluorescent material has been demanded.

An object of one aspect of the present invention is to provide a method for producing a fluorescent material having a chlorosilicate composition that is capable of providing a light emitting device having excellent durability, a fluorescent material, and a light emitting device.

Specific examples for achieving objects will be described below, and the present disclosure includes the following exemplary embodiments.

According to a first embodiment of the present disclosure, a method of producing a fluorescent material, includes: preparing a calcined product having a chlorosilicate composition containing at least one element selected from the group consisting of Ca, Sr, and Ba, at least one element selected from the group consisting of Mg and Zn, at least one element selected from the group consisting of Eu, Ce, Tb, and Mn, Si, O, and Cl; and bringing the calcined product in contact with a fluorine-containing substance and heat-treating the calcined product in an inert gas atmosphere at a temperature in a range of 200° C. or more and 450° C. or less.

In a second embodiment, a fluorescent material includes: a fluorescent material core having a chlorosilicate composition containing at least one element selected from the group consisting of Ca, Sr, and Ba, at least one element selected from the group consisting of Mg and Zn, at least one element selected from the group consisting of Eu, Ce, Tb, and Mn, Si, O, and Cl; and a surface layer containing a fluorine-containing compound.

In a third embodiment, a light emitting device includes the fluorescent material and an excitation light source.

According to embodiments of the present disclosure, a method of producing a fluorescent material having a chlorosilicate composition that is capable of providing a light emitting device having excellent durability, a fluorescent material, and a light emitting device can be provided.

DETAILED DESCRIPTION

Figure 1:
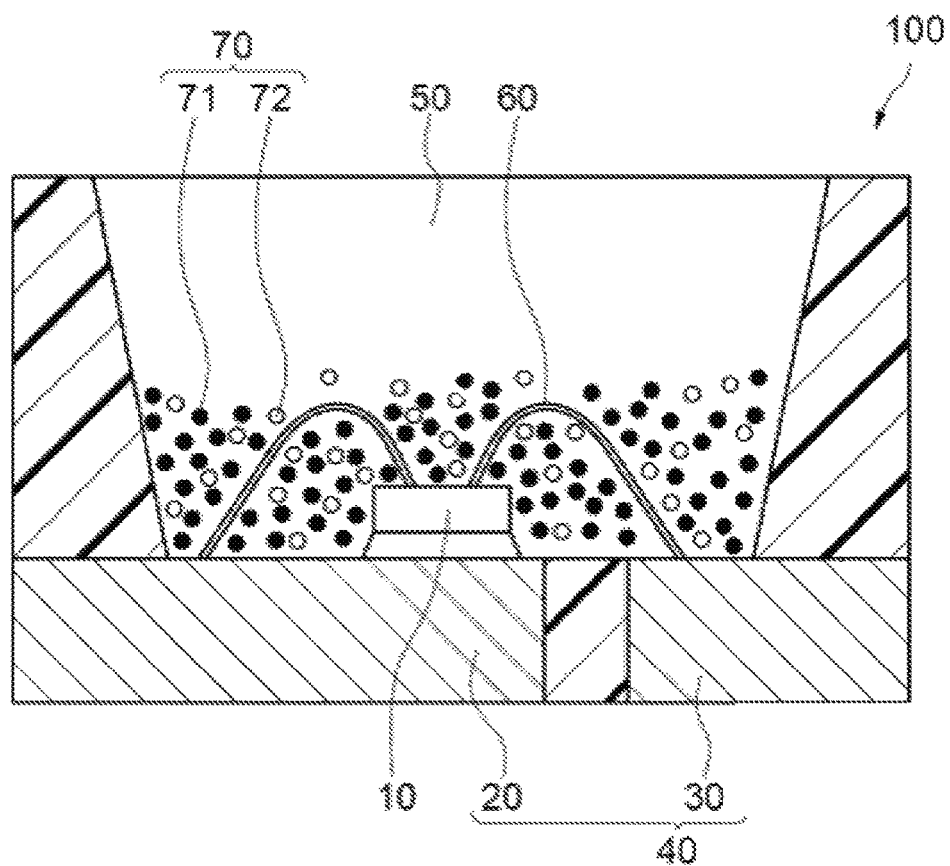
FIG. 1 is a schematic cross sectional view showing an example of a light emitting device.

A method of producing a fluorescent material, the fluorescent material, and the light emitting device according to the present disclosure will be described below. However, the embodiments shown below are examples for practicing the technical concept of the present invention, and the present invention is not limited to the methods of producing a fluorescent material, the fluorescent materials, and the light emitting devices shown below. In the description herein, the relationship between the color name and the chromaticity coordinate, the relationship between the wavelength range of light and the color name of monochromic light, and the like are in accordance with JIS Z8110. In the case where a composition contains plural substances that correspond to one component, the content of the component in the composition means the total amount of the plural substances contained in the composition, unless otherwise indicated.

Method of Producing Fluorescent Material

The method of producing a fluorescent material (which may be hereinafter referred to as a "production method") according to an embodiment includes: preparing a calcined product having a chlorosilicate composition containing at least one element selected from the group consisting of Ca, Sr, and Ba, at least one element selected from the group consisting of Mg and Zn, at least one element selected from the group consisting of Eu, Ce, Tb, and Mn, Si, O, and Cl; bringing the calcined product in contact with a fluorine-containing substance and heat-treating the calcined product in an inert gas atmosphere at a temperature in a range of 200° C. or more and 450° C. or less.

Preparing Calcined Product

The calcined product has a chlorosilicate composition containing at least one element selected from the group consisting of Ca, Sr, and Ba, at least one element selected from the group consisting of Mg and Zn, at least one element selected from the group consisting of Eu, Ce, Tb, and Mn, Si, O, and Cl.

The calcined product preferably has a composition represented by the following formula (I):

$$M^a{}_v Eu_w M^b{}_x Si_4 O_y Cl_z \quad (I)$$

wherein $M^a$ represents at least one element selected from the group consisting of Ca, Sr, and Ba; $M^b$ represents at least one element selected from the group consisting of Mg and Zn; and v, w, x, y, and z each are numbers satisfying $6.5 \leq v \leq 8.0$, $0.01 \leq w \leq 2.0$, $0.8 \leq x \leq 1.2$, $14.0 \leq y \leq 18.0$, and $1.0 \leq z \leq 2.0$.

In the formula (I), $M^a$ preferably contains at least one of Ca and Sr from the standpoint of the enhancement of the light emission intensity of the fluorescent material. In the case where $M^a$ contains at least one of Ca and Sr, the total molar ratio of Ca and Sr contained in $M^a$ is, for example, preferably 85% by mol or more, and more preferably 90% by mol or more. $M^b$ preferably contains at least Mg from the standpoint of the stability of the crystal structure. In the case where $M^b$ contains Mg, the molar ratio of Mg contained in $M^b$ is, for example, preferably 80% by mol or more, and more preferably 90% by mol or more. In the formula (I), a part of Eu may be replaced by at least one element selected from the group consisting of Ce, Tb, and Mn.

In the formula (I), v, w, x, y, and z are not particularly limited, as long as these numbers satisfy the aforementioned numerical value ranges. The parameter v preferably satisfies $6.5 \leq v \leq 8.0$, and more preferably $7.0 \leq v \leq 8.0$, from the standpoint of the stability of the crystal structure. The parameter w is the activation amount of Eu, and the parameter w may be selected from the appropriate range capable of achieving the target characteristics. The parameter w preferably satisfies $0.01 \leq w \leq 2.0$, and more preferably $0.02 \leq w \leq 1.8$. The parameter x preferably satisfies $0.8 \leq x \leq 1.2$, and more preferably $0.9 \leq x \leq 1.1$, from the standpoint of the stability of the crystal structure. The parameter y preferably satisfies $14.0 \leq y \leq 18.0$, and more preferably $14.0 \leq y \leq 17.0$, from the standpoint of the stability of the crystal structure.

Materials

The materials for forming the calcined product are not particularly limited, as long as the calcined product having a chlorosilicate composition containing at least one element selected from the group consisting of Ca, Sr, and Ba, at least one element selected from the group consisting of Mg and Zn, at least one element selected from the group consisting of Eu, Ce, Tb, and Mn, Si, O, and Cl can be provided.

A compound containing at least one element selected from the group consisting of Mg, Ca, Sr, and Ba, which is an alkaline earth metal element, as the material may be a halide, an oxide, a carbonate, a phosphate, a silicate, or an ammonium salt containing at least one element selected from the group consisting of Mg, Ca, Sr, and Ba. Instead of the compound, an elemental substance of Mg, Ca, Sr, or Ba, and a nitride containing at least one element selected from the group consisting of Mg, Ca, Sr, and Ba may also be used as the material. Specific examples of the material include $MgF_2$, $MgCl_2$, $MgO$, $MgCO_3$, $CaF_2$, $CaCl_2$, $CaCO_3$, $SrN_2$, $SrN$, $Sr_3N_2$, $SrF_2$, $BaF_2$, $BaCl_2$, $BaO$, $BaCO_3$, and $Ba_3N_2$, and at least one selected from the group consisting of these compounds may be used.

As the material, Si and Zn contained in the chlorosilicate composition is preferably an oxide or a hydroxide, and an oxynitride, a nitride compound, an imide compound, and an amide compound may also be used. Specifically, the material used may be $SiO_2$, $ZnO$, and $Zn(OH)_2$, and $Si_3N_4$ and $Si(NH_2)_2$ may also be used as the additional material. The calcined product having the chlorosilicate composition that is inexpensive and good in crystallinity may be formed by using an elemental substance of Si or Zn. The compound containing Si or Zn that is used as the material preferably has high purity, and may contain other element than Si or Zn, such as Li, Na, K, B, and Cu. The compound containing Si used as the material may be the compound, a part of Si of which is replaced by at least one element selected from the group consisting of Ge, Sn, Ti, Zr, Hf, Al, Ga, In, and Tl.

The at least one element selected from the group consisting of Eu, Ce, Tb, and Mn is an activation agent. As the material, a compound containing at least one element selected from the group consisting of Eu, Ce, Tb, and Mn may be used, and in particular a compound containing Eu is preferably used.

In the case where the compound containing Eu is used, a halide, an oxide, a carbonate, a phosphate, a silicate, and the like containing Eu may be used. In the compound containing Eu, a part of Eu may be replaced by Sc, Y, La, Ce, Pr, Nd, Sm, Gd, Tb, Dy, Ho, Er, Tm, Yb, Lu, and the like. In the case where a part of Eu is replaced by the other elements, the other elements function as a co-activation agent. The use of the co-activation agent enables the change of the hue of the fluorescent material and also enables the control of the light emission characteristics thereof. As an elemental substance of Eu and a compound containing Eu, metallic europium, europium oxide ($Eu_2O_3$) and europium nitride (EuN) may be used. An imide compound and an amide compound containing Eu may also be used. In the case where a mixture containing plural compounds essentially containing Eu is used as the material, a calcined product having a target compositional ratio can be obtained by changing the mixing ratio of the material.

The materials each may have an average particle diameter in a range of approximately 0.1 μm or more and 15 μm or less, and more preferably in a range of approximately 0.1 μm or more and 10 μm or less, from the standpoint of the reactivity with other material and the control of the particle diameter on calcining and after calcining. The material that has a particle diameter exceeding the range may be pulverized to provide the material that has an average particle diameter within the range.

The materials preferably have been purified. The use of the purified materials may omit purification of the materials, and thus the production process of the fluorescent material can be simplified to produce the fluorescent material inexpensively.

An elemental substance of the element contained in the target calcined product or an oxide, a carbonate, or a nitride containing the at least one element contained in the calcined product as the material is weighed to make the target compositional ratio of the calcined product with the material.

In the case where the calcined product having a chlorosilicate composition represented by the formula (I) is to be provided, specifically, the materials are weighed to provide the molar ratio of the $M^a$ amount, the Eu amount, the $M^b$ amount, the Si amount, and the Cl amount satisfying $M^a$/Eu/$M^b$/Si/Cl of (6.5 to 8.0)/(0.01 to 2.0)/(0.8 to 1.2)/4/(1.0 to 2.5) in the mixture of the material.

The weighed materials are mixed by a wet method or a dry method with a mixer to provide a material mixture. The mixer used may be a ball mill that is generally industrially used, and a pulverizer, such as a vibration mill, a roll mill, and a jet mill, may also be used. The material may have an increased surface area through pulverization. The material may also be classified for making the surface area within a certain range by using a wet separator, such as a sedimentation tank, a hydrocyclone, and a centrifugal separator, and a dry classifier, such as a cyclone and an air separator.

Material Mixture

The materials are mixed to provide a material mixture.

Flux

The material mixture may contain a flux. In the case where material mixture contains a flux, the reaction among the materials is further accelerated, and the solid phase reaction proceeds more uniformly. Accordingly, a calcined product having a large particle diameter for providing a fluorescent material excellent in light emission characteristics can be produced. This is because, for example, the heat treatment for providing the calcined product is performed at a temperature in a range of 1,000° C. or more and 1,250° C. or less, and in the case where a halide or the like is used as the flux, it is considered that the temperature is the substantially same as the formation temperature of the liquid phase of the halide. Examples of the halide used as the flux include a chloride and a fluoride of a rare earth metal, such as cerium and europium, and an alkali metal. The flux may be added to make the elemental ratio of cations contained in the flux that provides the target composition of the resulting calcined product, and the flux may be further added to the material mixture that has been obtained by mixing the materials to provide the composition of the target calcined product in advance.

In the case where the material mixture contains the flux, the flux activates the reactivity, but a too large amount thereof may cause a possibility of decreasing the light emission intensity of the resulting fluorescent material. Therefore, the content thereof is, for example, preferably 10% by mass or less, and more preferably 5% by mass or less, based on the material mixture.

Calcining

The material mixture is placed on a crucible or a boat formed of SiC, quartz, alumina, BN, or the like, and calcined in a furnace. By calcining the material mixture, powder of the calcined product is obtained.

The material mixture is preferably calcined in a nitrogen atmosphere having reducibility. The calcining atmosphere is more preferably a nitrogen atmosphere containing hydrogen gas having reducibility. The calcining atmosphere may also a reductive atmosphere using solid carbon in the air atmosphere, or the like.

By calcining in an atmosphere having high reducing power, such as a reductive atmosphere containing hydrogen and nitrogen, a calcined product for providing a fluorescent material having a chlorosilicate composition emitting green light having a large light emission intensity is produced. The calcined product calcined in an atmosphere having high reducing power has a large light emission intensity due to the large content ratio of $Eu^{2+}$ with respect to the total Eu amount contained in the calcined product. While divalent Eu tends to become trivalent Eu through oxidation, $Eu^{3+}$ is reduced to $Eu^{2+}$ by calcining the material mixture in a reductive atmosphere having high reducing power containing hydrogen and nitrogen. Accordingly, the content ratio of $Eu^{2+}$ is increased with respect to the total Eu amount contained in the calcined product, and thus a fluorescent material having a large light emission intensity can be produced.

The calcining may be performed in such a manner that primary calcining is performed, and then secondary calcining is performed, and the calcining may be performed plural times. The calcining temperature is preferably in a range of 1,000° C. or more and 1,250° C. or less, and more preferably in a range of 1,100° C. or more and 1,250° C. or less. When the calcining temperature is low, a calcined product having the target composition tends to be difficult to form, and when the calcining temperature is high, the calcined product may be decomposed to impair the light emission characteristics of the fluorescent material obtained by using the calcined product.

The calcining time per one time calcining is preferably in a range of 1 hour or more and 30 hours or less. In one time calcining, the calcining may be performed by changing the temperature stepwise. For example, two-step calcining (or multi-step calcining) may be performed, in which the first step calcining is performed at a temperature in a range of 800° C. or more and 1,000° C. or less, and after increasing the temperature gradually, the second step calcining is performed at a temperature in a range of 1,000° C. or more and 1,300° C. or less.

Post-Process of Calcined Product

The calcined product may be subjected to a post-process, such as pulverization, dispersion, solid-liquid separation, and drying. The solid-liquid separation may be performed by the method that is generally industrially used, such as filtration, suction filtration, pressure filtration, centrifugal separation, and decantation. The drying may be performed by the equipment that is generally industrially used, such as a vacuum dryer, a hot air dryer, a conical dryer, and a rotary evaporator.

The calcined product preferably has a crystal structure in the most part of the particles. For example, a glass material (amorphous material) has a loose crystal structure and thus has a compositional ratio that is not constant within the calcined product, providing a possibility of unevenness in chromaticity of the fluorescent material using the calcined product. Accordingly, for avoiding the unevenness in chromaticity, the reaction condition in the production process of the calcined product is necessarily controlled strictly uniform. A fluorescent material having a crystal structure in the most part of the particles is easily processed and facilitates the production of a light emitting device. A fluorescent material having a crystal structure in the most part of the particles can be easily dispersed uniformly in a resin, and thus emitting plastics, a light emitting polymer thin film material, and the like can be easily prepared. Specifically, the calcined product used for the fluorescent material having a chlorosilicate composition may contain a crystal phase in an amount of, for example, 50% by mass or more, and preferably 80% by mass or more. The value shows the ratio of the crystal phase having light emission property in the fluorescent material having a chlorosilicate composition produced with the calcined product, and the amount of the crystal phase is preferably 50% by mass or more of the calcined product since the fluorescent material having a chlorosilicate composition capable of providing practical light emission can be produced. The fluorescent material having a larger light emission intensity can be produced with the calcined product having a larger content of the crystal phase contained thereon. Accordingly, the fluorescent material that is produced by using the calcined product having a large amount of the crystal phase can have a larger light emission intensity and can be easily processed. The presence of the crystal phase in the calcined product or the fluorescent material can be analyzed, for example, by an X-ray diffraction spectrum. In the case where the measured object has a crystal phase in a large proportion, a sharp diffraction peak appears in the X-ray diffraction spectrum, and in the case where the object is an amorphous material, a broad diffraction peak appears. The ratio of the crystal phase can be analyzed from the ratio of the sharp diffraction peak and the broad diffraction peak. In the case where a crystal phase of a compound other than chlorosilicate is formed, a diffraction peak appears at a position different from the diffraction peak indicating the crystal phase having a chlorosilicate composition.

Heat-Treating Calcined Product

The production method of the embodiment includes bringing the calcined product having a chlorosilicate composition in contact with a fluorine-containing substance and heat-treating the calcined product in an inert gas atmosphere at a temperature in a range of 200° C. or more and 450° C. or less. The temperature of the heat treatment is preferably more than 250° C. and less than 400° C. from the standpoint of the suppression of the deterioration of the resulting fluorescent material and the enhancement of the durability of the light emitting device.

By bringing the calcined product in contact with a fluorine-containing substance and heat-treating the calcined product in an inert gas atmosphere at a temperature in a range of 200° C. or more and 450° C. or less, a surface layer containing a fluorine-containing compound is formed on at least a part of the surface of the calcined product or the vicinity of the surface thereof. The resulting fluorescent material includes a surface layer containing a fluorine-containing compound on at least a part of a surface or a vicinity of the surface of a fluorescent material core constituted by the calcined product. It is considered that the surface layer containing a fluorine-containing compound functions as a protective film. When the temperature of the heat treatment is less than 200° C., it may be difficult to form the surface layer containing a fluorine-containing compound on the surface of the calcined product or the vicinity of the surface. When the temperature of the heat treatment exceeds 450° C., on the other hand, there is a possibility that the elements contained in the chlorosilicate composition of the calcined product undergo excessive reaction with fluorine, and the calcined product is decomposed. The resulting fluorescent material undergoes less fluctuation in hue even under an environment having relatively high temperature and humidity, and has excellent durability. A light emitting device having excellent durability can be produced by using the fluorescent material.

Fluorine-Containing Substance

The fluorine-containing substance is not particularly limited, as long as it is a substance that contains fluorine, and examples thereof include fluorine gas ($F_2$) and fluorine compounds. Examples of the fluorine compound include $CF_4$, $CHF_3$, $NH_4HF_2$, $NH_4F$, $SiF_4$, $KrF_2$, $XeF_2$, $XeF_4$, and $NF_3$. The fluorine-containing substance may be in a solid state or in a liquid state at ordinary temperature.

The fluorine-containing substance is preferably at least one selected from the group consisting of $F_2$, $CHF_3$, $CF_4$, $NH_4F_2$, $NH_4F$, $SiF_4$, $KrF_2$, $XeF_2$, $XeF_4$, and $NF_3$. The fluorine-containing substance is preferably $F_2$ (fluorine gas) or $NH_4F$ from the standpoint that these compounds can be uniformly brought in contact with the calcined product, followed by heat-treating, thereby suppressing the deterioration of the resulting fluorescent material and enhancing the durability of the light emitting device.

In the case where the fluorine-containing substance is in a solid state or a liquid state at ordinary temperature, the calcined product is preferably brought in contact with the fluorine-containing substance in an amount in a range of 1% by mass or more and 25% by mass or less in terms of fluorine element amount, taking the total amount of the calcined product and the fluorine-containing substance as 100%. The amount of the fluorine-containing substance to be brought in contact with the calcined product is more preferably in a range of 2% by mass or more and 22% by mass or less, and further preferably in a range of 3% by mass or more and 20% by mass or less, in terms of fluorine element amount based on the total amount of the calcined product and the fluorine-containing substance as 100%. It is expected that the constitution facilitates the formation of the film of the fluorine-containing compound on at least a part of the surface of the calcined product or the vicinity of the surface thereof. It has been considered that the fluorescent material having a chlorosilicate composition is deteriorated due to denaturation with high temperature water vapor under an environment having high temperature and high humidity. In the resulting fluorescent material, the surface layer containing a fluorine-containing compound functions as a protective layer, and thus in the case where the fluorescent material is mounted on a light emission device, the interior of the fluorescent material having a chlorosilicate composition is difficult to receive the influence of the external environment, thereby enhancing the durability of the light emitting device.

In the case where the fluorine-containing substance is in a gaseous state, the calcined product may be brought in contact with the fluorine-containing substance by disposing the calcined product in an inert gas atmosphere containing the fluorine-containing substance. In the case where the fluorine-containing substance is in a gaseous state, the calcined product may be disposed in an inert gas atmosphere containing the fluorine-containing substance, and the calcined product may be subjected to a heat treatment in the inert gas atmosphere containing the fluorine-containing substance at a temperature in a range of 200° C. or more and 450° C. or less. In the case where the fluorine-containing substance is $F_2$ (fluorine gas), and the calcined product is subjected to a heat treatment in an inert gas atmosphere containing $F_2$ at a temperature in a range of 200° C. or more and 450° C. or less, the concentration of $F_2$ in the inert gas atmosphere is preferably in a range of 2% by volume or more and 25% by volume or less, and more preferably in a range of 5% by volume or more and 22% by volume or less. When the concentration of $F_2$ in the inert gas atmosphere is less than the prescribed value, there may be a possibility of failing to provide the target durability. When the concentration of $F_2$ exceeds the prescribed value, there may be a possibility of fluorination up to the core of the fluorescent material, which may significantly decrease the light emission intensity.

Contact Temperature

The temperature of the environment, in which the calcined product is brought in contact with the fluorine-containing substance, may be room temperature (20° C.±5° C.) or the heat treatment temperature. Specifically, the temperature may be in a range of 20° C. or more and less than 200° C., and may also be the aforementioned heat treatment temperature. In the case where the temperature of the environment, in which the calcined product is brought in contact with the fluorine-containing substance that is in a solid state in a normal temperature, is in a range of 20° C. or more and less than 200° C., the calcined product is brought in contact with the fluorine-containing substance and subjected to a heat treatment at a temperature in a range of 200° C. or more and 450° C. or less. The temperature of the heat treatment is preferably in a range of more than 250° C. and less than 400° C. from the standpoint of suppressing the deterioration of the resulting fluorescent material and easily enhancing the durability of the light emitting device using the fluorescent material.

Heat-Treating Atmosphere

The heat treatment is performed in an inert gas atmosphere. The inert gas atmosphere means an atmosphere that contains argon, helium, nitrogen or the like as a major component in the atmosphere. The inert gas atmosphere may contain oxygen as an unavoidable impurity in some cases. Herein, an atmosphere that has a concentration of oxygen contained in the atmosphere of 15% by volume or less is designated as the inert gas atmosphere. The concentration of oxygen in the inert gas atmosphere is preferably 10% by volume or less, more preferably 5% by volume or less, and further preferably 1% by volume or less. The concentration of oxygen that exceeds the prescribed value may provide a possibility of oxidizing the particles of the fluorescent material excessively. In the case where the fluorine-containing substance is in a gaseous state, taking the safety into consideration, the heat treatment is preferably performed in an atmosphere containing an inert gas and the fluorine-containing substance rather than in an atmosphere containing the fluorine-containing substance solely Heat-Treating Temperature The temperature, at which the calcined product is brought in contact with the fluorine-containing substance, and subjected to a heat treatment in the inert gas atmosphere, is in a range of 200° C. or more and 450° C. or less. The temperature for the heat treatment is more preferably in a range of 250° C. and 400° C. or less. The temperature for the heat treatment is further preferably more than 250° C. or more and less than 400° C. The temperature for the heat treatment is still further preferably in a range of 300° C. or more and 350° C. or less. When the temperature is in the range, the durability of the resulting fluorescent material having a chlorosilicate composition may be further enhanced.

In the case where the temperature for the heat treatment is less than the prescribed temperature, it is difficult to form the compound containing fluorine on the surface of the calcined product or in the vicinity of the surface thereof, thereby failing to provide a durable fluorescent material. In the case where the temperature for the heat treatment exceeds the prescribed temperature, it is considered that the crystal structure of the calcined product having the particular composition tends to be broken, thereby failing to retain a fluorescent material having a chlorosilicate composition having the target hue. The temperature for the heat treatment is preferably more than 250° C. and less than 400° C. from the standpoint of enhancing the durability of the light emitting device and preventing the relative light emission intensity from being lowered.

Heat-Treating Time

The period of time for the heat treatment is not particularly limited, and is preferably in a range of 1 hour or more and 10 hours or less, and more preferably in a range of 2 hours or more and 8 hours or less. In the case where the heat treatment time is in a range of 1 hour or more and 10 hours or less, the surface layer containing a fluorine-containing compound is formed on the surface of the calcined product or in the vicinity of the surface thereof through the contact of the calcined product with the fluorine-containing substance and the heat treatment in the inert gas atmosphere.

Post-Process

The method of producing a fluorescent material may further contain a post-process performing cracking, pulverizing, classifying, and the like of the resulting fluorescent material, after the heat treatment.

Fluorescent Material

The fluorescent material according to one embodiment of the present disclosure (which may be hereinafter referred to as the "fluorescent material") includes: a fluorescent material core having a chlorosilicate composition containing at least one element selected from the group consisting of Ca, Sr, and Ba, at least one element selected from the group consisting of Mg and Zn, at least one element selected from the group consisting of Eu, Ce, Tb, and Mn, Si, O, and Cl; and a surface layer containing a fluorine-containing compound. The fluorescent material includes the fluorescent material core having a chlorosilicate composition and the surface layer containing a fluorine-containing compound, and thereby the surface layer protects the fluorescent material core to provide excellent durability under an environment having relatively high temperature and humidity.

The fluorine-containing compound contained in the surface layer of the fluorescent material may have a composition containing the at least one element selected from the group consisting of Ca, Sr, and Ba, the at least one element selected from the group consisting of Mg and Zn, the at least one element selected from the group consisting of Eu, Ce, Tb, and Mn, Si, O, and Cl, which are contained in the composition of the fluorescent material core, and further containing (F) fluorine. It is considered that a part of the elements constituting the crystal structure of the fluorescent material core is replaced by fluorine, and thereby the surface layer having high durability to temperature and humidity is formed.

Figure 6:
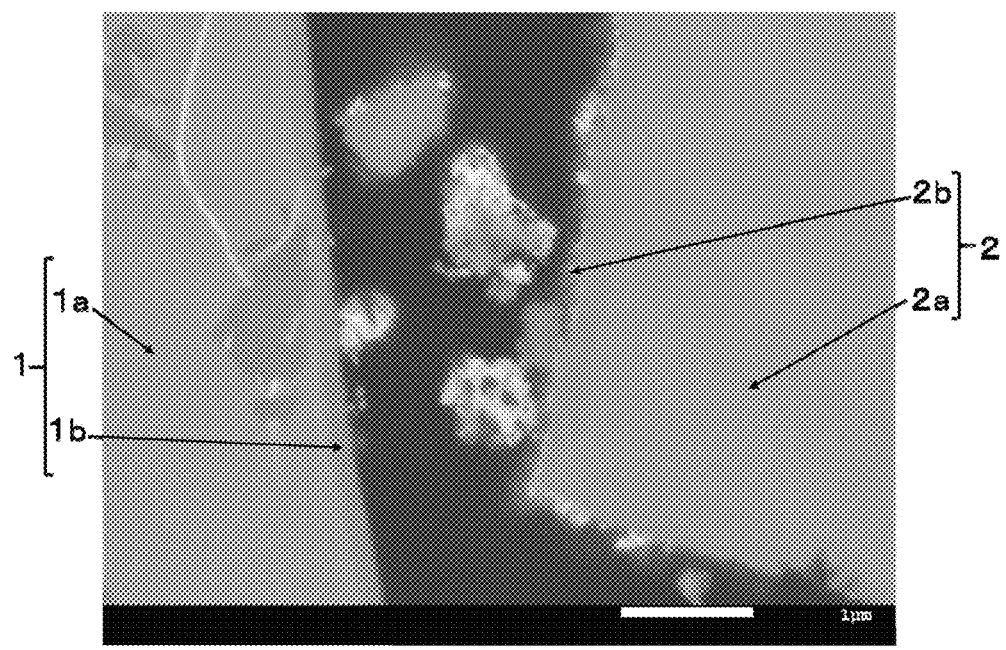
FIG. 6 is an SEM micrograph of a reflected electron image of cross sections of one particle and another particle of one of the exemplary fluorescent materials.
Figure 7:
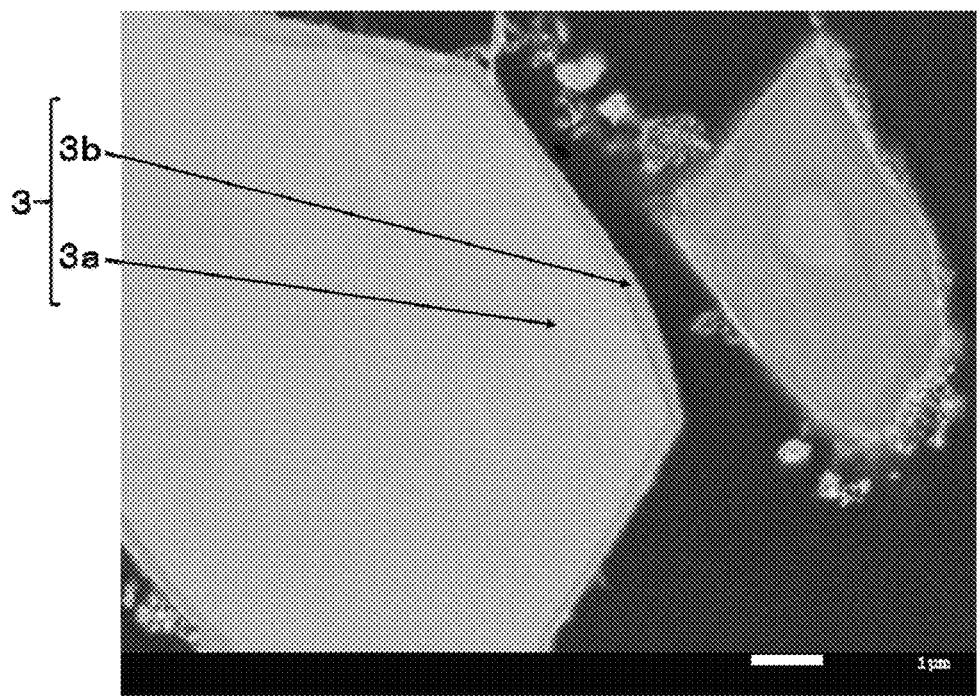
FIG. 7 is an SEM micrograph of a reflected electron image of a cross section of one particle of another one of the exemplary fluorescent materials.

The surface layer containing the fluorine-containing compound of the fluorescent material suffices to be disposed to cover at least a part of the surface of the fluorescent material core, and is preferably disposed to cover the entire surface of the fluorescent material core. The surface layer of the fluorescent material can be confirmed in such a manner, as described in the examples later, that the fluorescent material particles are embedded in a resin, the resin is cured and then cut to expose the cross sections of the fluorescent material particles, and the cross sections of the fluorescent material particles are observed with a scanning electron microscope (SEM). As shown in FIGS. 6 and 7 described in the examples later, in the SEM micrograph showing the reflected electron image of the cross section of the fluorescent material particles, it can be confirmed that the fluorescent material particles each has the fluorescent material core, and on the surface of the fluorescent material core, separately therefrom, the surface layer having a difference in color density from the fluorescent material core.

It is considered that the amount of fluorine contained in the surface layer of the fluorescent material varies depending on the amount of fluorine that is reacted with the crystal structure constituting the fluorescent material core. The amount of fluorine that is reacted with the crystal structure constituting the fluorescent material core varies depending on the surface state of the fluorescent material core and the state of the crystal structure constituting the fluorescent material core, such as the presence of lattice defects and the like and the amount thereof. In the compositional ratio (molar ratio) of the elements contained in the surface layer of the fluorescent material, the compositional ratio (molar ratio) of fluorine contained in the surface layer of the fluorescent material may be, for example, in a range of more than 0.0 and 12.0 or less, in a range of 0.1 or more and 11.0 or less, or in a range of 0.2 or more and 10.0 or less, assuming that the compositional ratio (molar ratio) of silicon (Si) is 4. When the compositional ratio (molar ratio) of fluorine contained in the surface layer of the fluorescent material is in the range, the fluorescent material may have excellent durability to temperature and humidity due to the presence of the surface layer.

The surface layer of the fluorescent material preferably has a thickness in a range of 0.05 μm or more and 0.80 μm or less. The thickness of the surface layer of the fluorescent material is more preferably in a range of 0.06 μm or more and 0.75 μm or less, more preferably in a range of 0.07 μm or more and 0.70 μm or less, and further preferably in a range of 0.08 μm or more and 0.65 μm or less. When the thickness of the surface layer of the fluorescent material is in the range, the surface layer may protect the fluorescent material core while suppressing reflection of light from the excitation light source and retaining the target light emission intensity, and even under an environment having relatively high temperature and humidity, the change of the hue of the fluorescent material may be suppressed, and the durability thereof may be enhanced.

The thickness of the surface layer of the fluorescent material can be confirmed in such a manner, as described in the examples later, that the fluorescent material particles are embedded in a resin, the resin is cured and then cut to expose the cross sections of the fluorescent material particles, the cross sections of the fluorescent material particles are observed with a scanning electron microscope (SEM), and the thickness of the surface layer can be measured from the resulting image. As shown in FIGS. 6 and 7 described in the examples later, in the SEM micrograph showing the reflected electron image of the cross section of the fluorescent material particles, the average thickness of the surface layer is approximately from 0.2 μm to 0.3 μm. The fluorescent material preferably has an average thickness of the surface layer containing the fluorine-containing compound in a range of 0.05 μm or more and 0.8 μm or less.

The fluorescent material core contained in the fluorescent material preferably has a composition represented by the following formula (I). The fluorescent material core preferably has the substantially same composition as the calcined product.

$$M^a_v Eu_w M^b_x Si_4 O_y Cl_z \qquad (I)$$

In the formula (I), $M^a$ represents at least one element selected from the group consisting of Ca, Sr, and Ba; $M^b$ represents at least one element selected from the group consisting of Mg and Zn; and v, w, x, y, and z each are numbers satisfying $6.5 \leq v \leq 8.0$, $0.01 \leq w \leq 2.0$, $0.8 \leq x \leq 1.2$, $14.0 \leq y \leq 18.0$, and $1.0 \leq z \leq 2.0$.

The fluorine-containing compound contained in the surface layer of the fluorescent material preferably contains the elements constituting the chlorosilicate composition of the fluorescent material core, and further contains fluorine.

In the case where the fluorine-containing compound contained in the surface layer of the fluorescent material preferably contains the elements constituting the chlorosilicate composition of the fluorescent material core, the compositional ratios (molar ratios) of the elements contained in the fluorine-containing compound may be different from those of the elements contained in the fluorescent material core in some cases. The surface layer of the fluorescent material may partially contain a compound having a composition that is different from the compound having the chlorosilicate composition.

The fluorescent material preferably contains fluorine element in an amount in a range of 1.0% by mass or more and 20.0% by mass or less. The fluorescent material more preferably contains fluorine element in an amount in a range of 2.0% by mass or more and 15.0% by mass or less, and further preferably contains fluorine element in an amount in a range of 2.5% by mass or more and 12.0% by mass or less. It is expected that the fluorine element contained in the fluorescent material is mainly the fluorine element contained in the fluorine-containing compound contained in the surface layer. When the content of fluorine element of the fluorescent material is in the range, it is considered that the surface layer containing the fluorine-containing compound functions as a protective layer to prevent the fluorescent material core from receiving the influence of the external environment, such as the temperature and the humidity, and even under an environment having relatively high temperature and humidity, the change of the hue of the fluorescent material may be suppressed, and the durability thereof may be enhanced.

The fluorescent material is preferably activated by europium (Eu), and emits green light through absorption of near ultraviolet ray or blue light. The fluorescent material may absorb light having a wavelength in a range of 430 nm or more and 500 nm or less, which is a wavelength range of from ultraviolet ray to the short wavelength side of visible light, and may emit fluorescent light having a light emission peak in a wavelength in a range of 505 nm or more and 530 nm or less. The use of the excitation light source having the aforementioned wavelength range may efficiently excite the fluorescent material and may enhance the light emission intensity of the fluorescent material. In particular, the excitation light source having a main peak light emission wavelength in a range of 400 nm or more and 480 nm or less is preferably used, and the excitation light source having a main peak light emission wavelength in a range of 420 nm or more and 460 nm or less is more preferably used.

The fluorescent material preferably has a light emission spectrum having a peak light emission wavelength in a range of 505 nm or more and 530 nm or less. In the light emission spectrum of the fluorescent material, the peak light emission wavelength is preferably in a range of 506 nm or more and 529 nm or less. The half bandwidth of the light emission peak in the light emission spectrum of the fluorescent material is not particularly limited, and may be, for example, 75 nm or less, and is preferably 70 nm or less. The half bandwidth of the light emission peak in the light emission spectrum of the fluorescent material may be, for example, 45 nm or more.

In the fluorescent material, europium (Eu) as a rare earth is preferably a center of light emission. However, the center of light emission of the fluorescent material is not limited to europium, a part thereof may be replaced by an additional element of another rare earth metal, and Eu and the additional element may be used as a co-activation agent. $Eu^{2+}$ as a divalent rare earth ion stably exists in the crystal structure and emits light by selecting the appropriate crystal structure.

The average particle diameter of the fluorescent material is preferably 2.0 μm or more, more preferably 4.0 μm or more, and further preferably 5.0 μm or more, and is preferably 30.0 μm or less, more preferably 25.0 μm or less, and further preferably 20.0 μm or less.

When the average particle diameter of the fluorescent material is the prescribed value or more, there is a tendency that the absorbance of the fluorescent material to excitation light and the light emission intensity thereof are increased. By using the fluorescent material excellent in light emission characteristics in a light emitting device described later, the luminous efficiency of the light emitting device may be enhanced. When the average particle diameter is the prescribed value or less, the workability in the production process of the light emitting device can be enhanced.

The average particle diameter of the fluorescent material is a particle diameter providing a volume cumulative frequency of 50% from the small diameter side (i.e., a median diameter) that is measured with a laser diffraction particle size distribution measuring equipment (product name: Master Sizer 2000, available from Malvern Instruments, Ltd.) in the description.

Light Emitting Device

A light emitting device containing the fluorescent material as a constitutional element of a wavelength conversion member will be described. The light emitting device of an embodiment (which may be hereinafter referred to as the "light emitting device") includes the fluorescent material and an excitation light source. The light emitting device preferably includes the fluorescent material including the fluorescent material core having a chlorosilicate composition and the surface layer containing the fluorine-containing compound, and an excitation light source that emits light having a wavelength in a range of 350 nm or more and 500 nm or less.

The excitation light source used may be a light emitting element. The light emitting element may emit light having a wavelength in a range of 350 nm or more and 500 nm or less. The light emitting element preferably has a peak light emission wavelength in a wavelength in a range of 400 nm or more and 480 nm or less since the fluorescent material may be efficiently excited thereby. The use of the light emitting element as the excitation light source can constitute a light emitting device that emits mixed color light of the light from the light emitting element and the fluorescent light from the fluorescent material.

The half bandwidth of the light emission peak in the light emission spectrum of the light emitting element is not particularly limited, and may be, for example, 30 nm or less. The light emitting element used is preferably a semiconductor light emitting element. The use of a semiconductor light emitting element as the light source may provide a light emitting device that has a high efficiency and a high linearity of the output with respect to the input, and is stable with high resistance to mechanical impacts. Examples of the semiconductor light emitting element include a semiconductor light emitting element using a nitride semiconductor ($In_XAl_YGa_{1-X-Y}N$, wherein X and Y satisfy $0 \leq X$, $0 \leq Y$, and $X+Y \leq 1$).

The fluorescent material is preferably excited by light having a wavelength in a range of 350 nm or more and 500 nm or less, and preferably has a peak light emission wavelength in a wavelength in a range of 505 nm or more and 530 nm or less. The light emitting device preferably includes the fluorescent material as a first fluorescent material, and a second fluorescent material having a peak light emission wavelength that is different from the first fluorescent material.

The first fluorescent material may constitute the light emitting device, for example, in such a manner that the first fluorescent material is contained in a fluorescent member that covers the excitation light source. In the light emitting device having the excitation light source that is covered with the fluorescent member containing the first fluorescent material, a part of light emitted by the excitation light source is absorbed by the first fluorescent material, and emitted as green light. The use of the excitation light source that emits light in a wavelength in a range of 350 nm or more and 500 nm or less may enable more effective use of the emitted light. The fluorescent member may contain a resin and the first fluorescent material, and may further contain the second fluorescent material depending on necessity.

The content of the first fluorescent material contained in the light emitting device is not particularly limited, and may be appropriately selected depending on the final target color. For example, the content of the first fluorescent material may be in a range of 1 part by mass or more and 100 parts by mass or less, and preferably in a range of 2 parts by mass or more and 70 parts by mass or less, per 100 parts by mass of the resin contained in the fluorescent member.

The light emitting device may contain the second fluorescent material that has a different peak light emission wavelength from the first fluorescent material. For example, the light emitting device may contain a light emitting element emitting blue light, and may further appropriately contain the first fluorescent material and the second fluorescent material, which are excited by the light emitting element, and thereby the light emitting device can have a wide range of color reproducibility or a high color rendering property.

Examples of the second fluorescent material include fluorescent materials each having a peak light emission wavelength in a range of 500 nm or more and 580 nm or less, each having a composition represented by any one of the formulae (IIIa), (IIIb), and (IIIc) below, and fluorescent materials each having a peak light emission wavelength in a range of 580 nm or more and 650 nm or less, each having a composition represented by any one of the formulae (IVa), (IVb), (IVc), and (IVd) below. The second fluorescent material preferably contains at least one fluorescent material having a composition represented by at least one of the formulae (IIIa), (IIIb), (IIIc), (IVa), (IVb), (IVc), and (IVd) below. For example, the first fluorescent material and the second fluorescent material are preferably used in combination from the standpoint of providing the light emitting device having a high color rendering property. The second fluorescent material used in combination with the first fluorescent material is particularly preferably a fluorescent material having a composition represented by the formula (IIIa) and/or a fluorescent material having a composition represented by the formula (IVa).

$$(Y,Gd,Tb,Lu)_3(Al,Ga)_5O_{12}:Ce \qquad (IIIa)$$

$$(La,Y)_3Si_6N_{11}:Ce \qquad (IIIb)$$

$$Si_{6-p}Al_pO_pN_{8-p}:Eu(0<p\leq4.2) \qquad (IIIc)$$

$$(Sr,Ca)AlSiN_3:Eu \qquad (IVa)$$

$$(Sr,Ca)LiAl_3N_4:Eu \qquad (IVb)$$

$$(Ba,Sr,Ca)_2Si_5N_8:Eu \qquad (IVc)$$

$$K_2(Si,Ge,Ti)F_6:Mn \qquad (IVd)$$

The second fluorescent material preferably has an average particle diameter in a range of 2 μm or more and 35 μm or less, and more preferably in a range of 5 μm or more and 30

μm or less. When the average particle size is the prescribed value or more, the light emission intensity can be further enhanced. When the average particle size is the prescribed value or less, the workability in the production process of the light emitting device can be enhanced.

The content of the second fluorescent material may be, for example, in a range of 1 part by mass or more and 200 parts by mass or less, and preferably in a range of 2 parts by mass or more and 180 parts by mass or less, per 100 parts by mass of the resin contained in the fluorescent member.

The mass ratio of the first fluorescent material and the second fluorescent material (first fluorescent material/second fluorescent material) contained in the fluorescent member may be, for example, in a range of 0.01 or more and 5 or less, and preferably in a range of 0.05 or more and 3 or less.

The first fluorescent material and the second fluorescent material (which may be hereinafter referred totally to as a "fluorescent material") may constitute, along with a sealing resin, a fluorescent member covering the light emitting element. Examples of the resin constituting the fluorescent member include thermosetting resins, such as a silicone resin, an epoxy resin, an epoxy-modified silicone resin, and a modified silicone resin.

The total content of the fluorescent material in the fluorescent member may be, for example, in a range of 5 parts by mass or more and 300 parts by mass or less, preferably in a range of 10 parts by mass or more and 250 parts by mass or less, more preferably in a range of 15 parts by mass or more and 230 parts by mass or less, and further preferably in a range of 15 parts by mass or more and 200 parts by mass or less, per 100 parts by mass of the resin. When the total content of the fluorescent material in the fluorescent member is in the range, the fluorescent material can efficiently perform the wavelength conversion of the light emitted by the light emitting element.

The fluorescent member may further contain a filler, a light diffusion material, and the like, in addition to the resin and the fluorescent material. For example, the incorporation of the filler or the light diffusion material may reduce the directionality of the light from the light emitting element for enhancing the viewing angle. Examples of the filler and the light diffusion material include silica, titanium oxide, zinc oxide, zirconium oxide, and alumina. In the case where the fluorescent member contains the filler and the light diffusion material, the content of the filler and the light diffusion material may be, for example, 1 part by mass or more and 20 part by mass or less per 100 parts by mass of the resin.

The type of the light emitting device is not particularly limited and may be appropriately selected from the types that have been generally used. Examples of the type of the light emitting device include a pin-through type and a surface-mounting type.

One example of the light emitting device will be described with reference to the drawing. FIG. 1 is a schematic cross sectional view showing an example of a light emitting device 100.

The light emitting device 100 has a package 40 having a recessed portion, a light emitting element 10, and a fluorescent member 50 covering the light emitting element 10. The light emitting element 10 is disposed inside the recessed portion of the package 40, and is electrically connected to a pair of lead electrodes (anode and cathode) 20 and 30 provided in the package 40, with conductive wires 60 respectively. The fluorescent member 50 is formed by filling a sealing resin containing a fluorescent material 70 in the recessed portion, and covers the light emitting element 10. The fluorescent member 50 contains, for example, the sealing resin and the fluorescent material 70 that performs wavelength conversion of light from the light emitting element 10. The fluorescent material 70 contains a first fluorescent material 71 and a second fluorescent material 72. The pair of lead electrodes (anode and cathode) 20 and 30 each are partially exposed outside the outer side surface of the package 40. The light emitting device 100 emits light with electric power externally supplied through the pair of lead electrodes 20 and 30.

The fluorescent member 50 functions as not only the wavelength conversion member, but also a member for protecting the light emitting element 10, the first fluorescent material 71, and the second fluorescent material 72, from the external environment. In FIG. 1, the first fluorescent material 71 and the second fluorescent member 72 are localized in the fluorescent member 50. By disposing the first fluorescent material 71 and the second fluorescent member 72 close to the light emitting element 10 in this manner, the wavelength conversion of the light from the light emitting element 10 can be efficiently performed, thereby providing a light emitting device excellent in luminous efficiency. The arrangement of the fluorescent member 50 containing the first fluorescent material 71 and the second fluorescent member 72, and the light emitting element 10 is not limited to the arrangement, in which they are disposed to be close to each other, and the light emitting element 10 and the first fluorescent material 71 and the second fluorescent member 72 may be spaced inside the fluorescent member 50 in consideration of the influence of heat on the first fluorescent material 71 and the second fluorescent member 72. The first fluorescent material 71 and the second fluorescent member 72 may be mixed in the fluorescent member 50 in a substantially uniform ratio over the entire fluorescent member 50, and thereby light having further suppressed color unevenness can be obtained.

EXAMPLES

Some aspect of the present invention will be described more specifically with reference to examples shown below.

Production Example 1

A calcined product having a chlorosilicate composition containing Ca, Mg, Eu, Si, O, and Cl was prepared. Specifically, for a calcined product having a composition represented by the general formula (I), $M^a{}_v Eu_w M^b{}_x Si_4 O_y Cl_z$, wherein $M^a$ is Ca, and $M^b$ is Mg, $CaCO_3$, $CaCl_2$, $Eu_2O_3$, MgO, and $SiO_2$ were used as materials. The materials were weighed to provide a charged molar ratio of Ca/Eu/Mg/Si/Cl of 7.5/0.5/1/4/2.5, and then mixed to provide a material mixture. Cl was mixed in a larger amount than the target compositional ratio (molar ratio) since Cl tends to fly in calcining. The material mixture was charged in an alumina boat, and then calcined in a hydrogen and nitrogen atmosphere at 1,170° C. for 10 hours, so as to provide a calcined product having a chlorosilicate composition represented by $Ca_{7.5}Eu_{0.5}MgSi_4O_{16}Cl_2$. Since the resulting calcined product contained particles that were sintered to each other, they were dispersed with alumina beads and then subjected to classification with a sieve for removing coarse particles and fine particles, thereby providing powder of a calcined product 1.

Example 1

The calcined product 1 was brought in contact with fluorine gas ($F_2$) and heat-treated in an atmosphere containing fluorine gas ($F_2$) and nitrogen gas ($N_2$) as an inert gas with a concentration of fluorine gas of 20% by volume and a concentration of nitrogen gas of 80% by volume at a temperature of 250° C. for a treatment time of 8 hours, so as to provide powder of a fluorescent material having a fluorescent material core having a chlorosilicate composition and a surface layer.

Comparative Example 1

The calcined product 1 was designated as powder of a fluorescent material having a chlorosilicate composition of Comparative Example 1.

Example 2

Powder of a fluorescent material having a fluorescent material core having a chlorosilicate composition and a surface layer was obtained under the same condition as in Example 1 except that the temperature for the heat treatment was 300° C.

Example 3

Powder of a fluorescent material having a fluorescent material core having a chlorosilicate composition and a surface layer was obtained under the same condition as in Example 1 except that the temperature for the heat treatment was 350° C.

Example 4

Powder of a fluorescent material having a fluorescent material core having a chlorosilicate composition and a surface layer was obtained under the same condition as in Example 1 except that the temperature for the heat treatment was 400° C.

Comparative Example 2

The fluorescent material having a chlorosilicate composition obtained in Comparative Example 1 was heat-treated in the air at a temperature of 350° C. for a treatment time of 8 hours, so as to provide powder of a fluorescent material having a fluorescent material core having a chlorosilicate composition and a surface layer.

Comparative Example 3

Powder of a fluorescent material having a chlorosilicate composition was obtained under the same condition as in Example 1 except that the temperature for the heat treatment was 25° C.

Comparative Example 4

Powder of a fluorescent material having a chlorosilicate composition was obtained under the same condition as in Example 1 except that the temperature for the heat treatment was 150° C.

Comparative Example 5

The fluorescent material obtained in Comparative Example 4 was heat-treated in the air at a temperature of 350° C. for a treatment time of 8 hours, so as to provide powder of a fluorescent material having a chlorosilicate composition.

Comparative Example 6

Powder of a fluorescent material having a chlorosilicate composition was obtained under the same condition as in Example 1 except that the temperature for the heat treatment was 500° C.

Comparative Example 7

The fluorescent material obtained in Comparative Example 1 was heat-treated in a nitrogen gas atmosphere having a nitrogen gas concentration of 99.9% by volume at a temperature of 350° C. for a treatment time of 8 hours, so as to provide powder of a fluorescent material having a chlorosilicate composition.

Example 5

The calcined product 1 and ammonium fluoride ($NH_4F$) were weighed to make an amount of fluorine element of 5% by mass based on the total amount of the calcined product 1 and ammonium fluoride $NH_4F$, and mixed to provide mixed powder. The mixed powder was heat-treated in a nitrogen gas atmosphere having a nitrogen gas concentration of 99.9% by volume at a temperature of 350° C. for a treatment time of 8 hours while bringing the calcined product 1 and ammonium fluoride ($NH_4F$) in contact with each other, so as to provide powder of a fluorescent material having a fluorescent material core having a chlorosilicate composition and a surface layer.

Example 6

Powder of a fluorescent material having a fluorescent material core having a chlorosilicate composition and a surface layer was obtained by performing the process under the same condition as in Example 5 except that mixed powder obtained by weighing ammonium fluoride ($NH_4F$) and mixing with the calcined product 1 to make an amount of fluorine element of 10% by mass was used.

Example 7

Powder of a fluorescent material having a fluorescent material core having a chlorosilicate composition and a surface layer was obtained by performing the process under the same condition as in Example 5 except that mixed powder obtained by weighing ammonium fluoride ($NH_4F$) and mixing with the calcined product 1 to make an amount of fluorine element of 20% by mass was used.

Evaluation

Light Emission Characteristics

The resulting fluorescent materials were measured for light emission characteristics. The light emission characteristics of the fluorescent materials were measured with a spectrofluorophotometer (product name: QE-2000, manufactured by Otsuka Electronics Co., Ltd.) with excitation light having a wavelength of 450 nm. The energy of the resulting light emission spectra (relative light emission intensity, %) was obtained. The results are shown in Tables 1 and 2 below. The relative light emission intensity was calculated taking the fluorescent material of Comparative Example 1 as 100%.

X-Ray Diffraction Spectra

Figure 2:
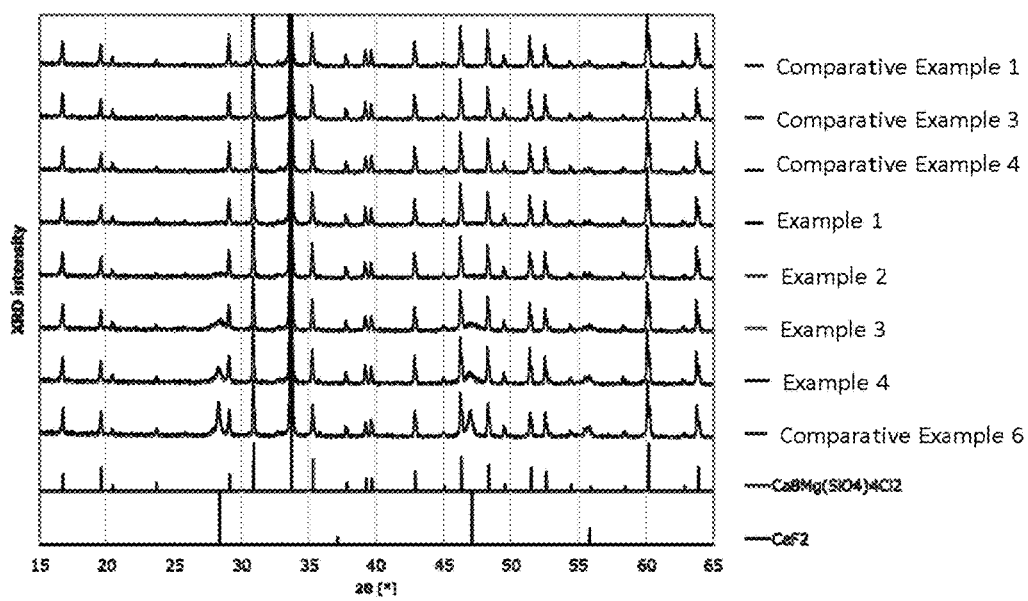
FIG. 2 is a diagram showing the X-ray diffraction (XRD) patterns of exemplary, comparative, and reference fluorescent materials.

The resulting fluorescent materials were measured for X-ray diffraction (XRD) spectra. The measurement was performed with a horizontal sample mount multipurpose X-ray diffractometer (product name: Ultima IV, manufactured by Rigaku Corporation) using a CuKα line. Examples of the resulting X-ray diffraction (XRD) patterns showing the diffraction intensity (XRD Intensity) with respect to the diffraction angle (2θ) are shown in FIG. 2. FIG. 2 shows the XRD patterns of the fluorescent materials in Comparative Examples 1, 3, and 4, Examples 1 to 4, and Comparative Example 6, and the XRD patterns of $Ca_8MgSi_4O_{16}Cl_2$ ($Ca_8Mg(SiO_4)_4Cl_2$) and $CaF_2$ registered in ICDD (a trade name, International Centre for Diffraction Data) for reference, in this order from the top to bottom.

Compositional Analysis 1

The resulting fluorescent materials were subjected to compositional analysis. Chlorine in the fluorescent material was quantitatively analyzed by the potentiometric titration method. Fluorine (F) in the fluorescent material was quantitatively analyzed by the UV-Vis spectra method using an UV-Vis spectrophotometer (manufactured by Hitachi, Ltd.) in the case where the fluorescent material contained fluorine in an amount of 1.0% by mass or more, or by the ion chromatography method with an ion chromatograph (manufactured by Dionex) in the case where the fluorescent material contained fluorine in an amount of less than 1.0% by mass.

The analysis conditions of the ion chromatography method were as follows.

Column: Ion Pack AS12 (4 mm)
Eluent: 2.7 mM $Na_2CO_3$, 0.3 m $NaHCO_3$
Suppressor: yes
Column temperature: 35° C.
Detector: conductivity detector
The results obtained are shown in Tables 1 and 2.

Compositional Analysis 2

For the resulting fluorescent materials, by the ICP emission analysis method using an energy dispersive X-ray spectrometer (EDS) (produced by Hitachi, Ltd.), compositional analysis was performed for the fluorescent material cores and the surface layers of one particle (Example 3-1) and another particle (Example 3-2) of the fluorescent material in Example 3, the fluorescent material core and the surface layer of one particle (Example 6-1) of the fluorescent material in Example 6, and the center portion (core portion) and the surface portion of one particle (Comparative Example 1-1) of the fluorescent material in Comparative Example 1, and the compositional ratios (molar ratios) of the elements contained in the portions were measured. The results are shown in Table 3 below. The compositional ratios (molar ratios) of the elements each are a value calculated when the compositional ratio (molar ratio) of Si is taken as 4.

Storage Test

Light emitting devices were produced by using the resulting fluorescent materials. The fluorescent materials of Examples and Comparative Examples each were used as the first fluorescent material, and $CaAlSiN_3$ excited by Eu having a light emission wavelength of 650 nm was used as the second fluorescent material, which were dispersed in a silicone resin to form fluorescent members. A nitride semiconductor light emitting element having a main wavelength of 451 nm was sealed with each of the fluorescent members, so as to produce a surface mounted light emitting device having a chromaticity (x,y) around (0.345,0.355). The light emitting device was stored at a temperature of 85° C. and a relative humidity of 85% for 500 hours, and then measured for the chromaticity y, and the change amount (absolute value, Δy) with respect to the chromaticity y before the storage was obtained.

SEM Micrograph—Secondary Electron Image

Figure 4:
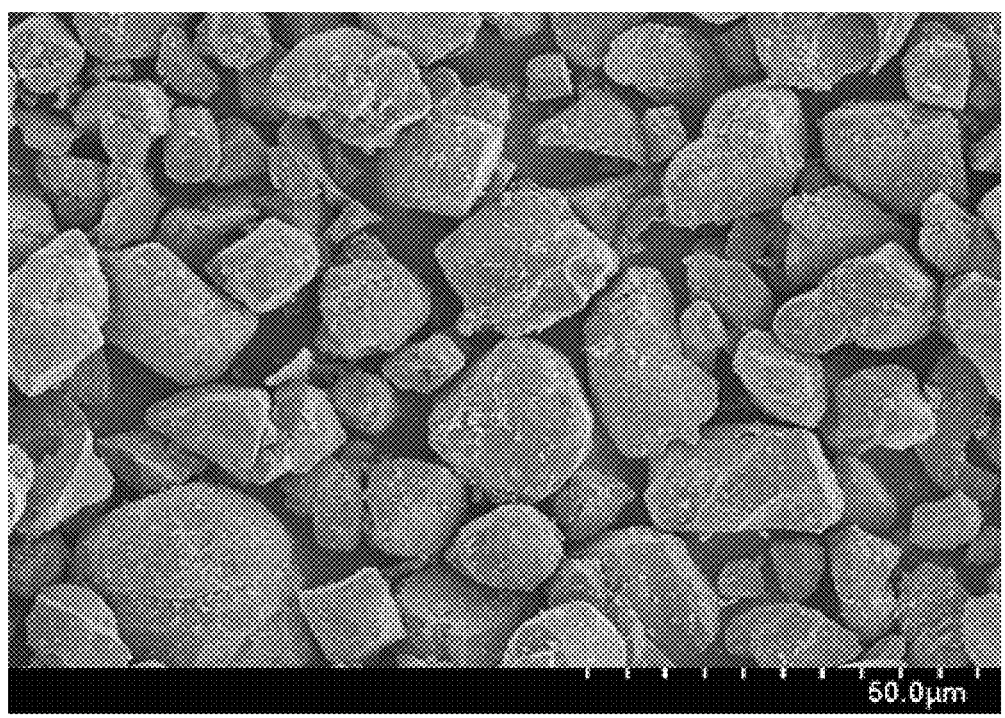
FIG. 4 is an SEM micrograph of a secondary electron image of one of the exemplary fluorescent materials.
Figure 5:
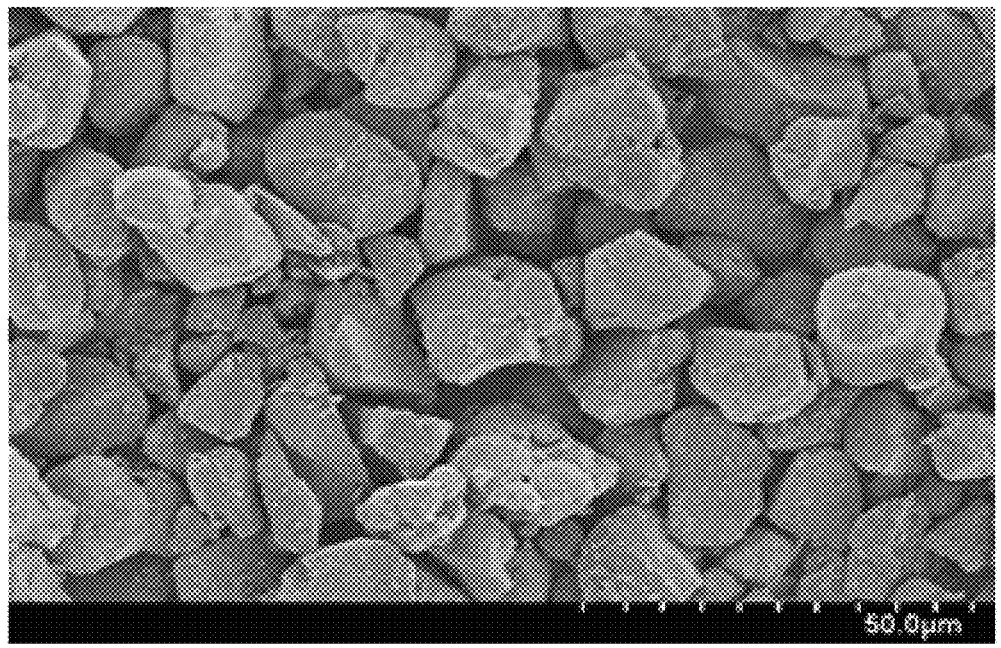
FIG. 5 is an SEM micrograph of a secondary electron image of one of the comparative fluorescent materials.

SEM micrographs of secondary electron images of the fluorescent material of Example 2 and the fluorescent material of Comparative Example 1 were obtained with a scanning electron microscope (SEM). FIG. 4 is the SEM micrograph of the fluorescent material of Example 2, and FIG. 5 is the SEM micrograph of the fluorescent material of Comparative Example 1.

SEM Micrograph—Reflected Electron Image

Figure 8:
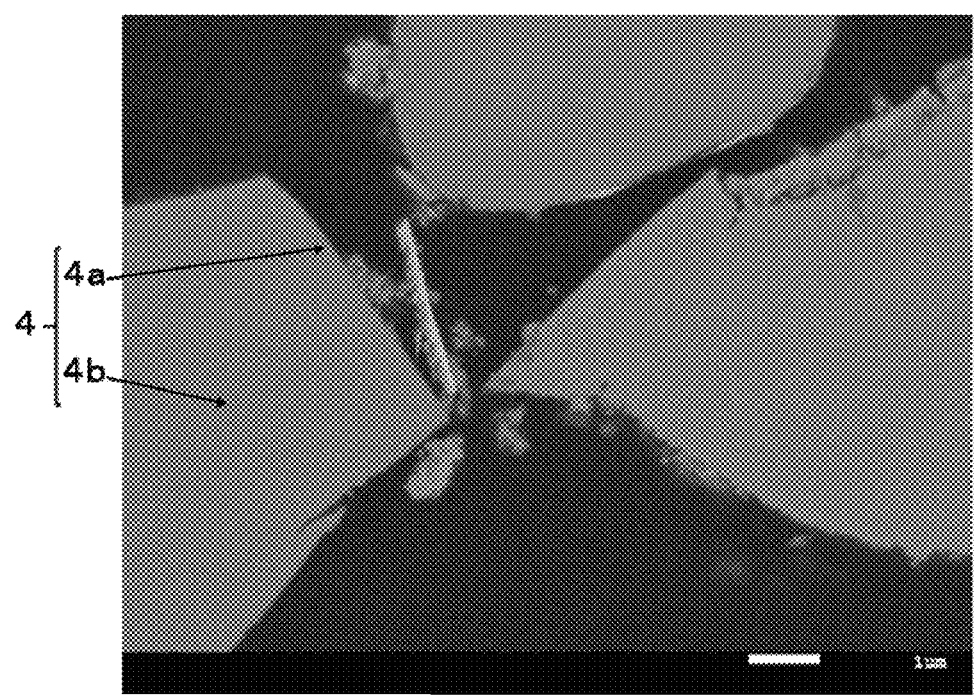
FIG. 8 is an SEM micrograph of a reflected electron image of a cross section of one particle of one of the comparative fluorescent materials.

The resulting fluorescent material particles were embedded in an epoxy resin, the epoxy resin was cured and then cut to expose the cross section of the fluorescent material particles, the surface of the cross section was polished with abrasive paper and then finished with a cross section polisher (CP), and the cross section of the fluorescent material particle was observed with a scanning electron microscope (SEM), so as to provide an SEM micrograph of a reflected electron image of the cross section of the fluorescent material particles. FIG. 6 is the SEM micrograph of the reflected electron image of cross sections of the fluorescent material particles containing the fluorescent material particle 1 of Example 3-1 and the fluorescent material particle 2 of Example 3-2. FIG. 7 is the SEM micrograph of the reflected electron image of cross sections of the fluorescent material particles containing the fluorescent material particle 3 of Example 6-1. FIG. 8 is the SEM micrograph of the reflected electron image of cross sections of the fluorescent material particles containing the fluorescent material particle 4 of Comparative Example 1-1.

Average Particle Diameter

The resulting fluorescent materials were measured for a particle diameter providing a volume cumulative frequency of 50% from the small diameter side (i.e., a median diameter) with a laser diffraction particle size distribution measuring equipment (product name: Master Sizer 2000, manufactured by Malvern Instruments, Ltd.), which was designated as the average particle diameter.

The contact conditions of the calcined product and the fluorine-containing substance and the heat treatment conditions in Examples 1 to 4 and Comparative Examples 1 to 6 are shown in Table 1. In Comparative Example 2, the calcined product was not in contact with a fluorine-containing substance, but an additional heat treatment was performed. In Comparative Example 5, both the contact of the calcined product with the fluorine-containing substance and the additional heat treatment were performed. The conditions thereof are shown in Table 1.

TABLE 1

| | Contact condition and heat treatment condition of fluorine-containing substance | | | | Condition of additional heat treatment | | | Average particle diameter (μm) | F content (% by mass) | Cl content (% by mass) | Relative light emission intensity (%) | Change amount of chromaticity y Δy |
| | Fluorine-containing compound | Contact temperature | Atmosphere | Contact time | Temperature | Atmosphere | Time | | | | | |
|---|---|---|---|---|---|---|---|---|---|---|---|---|
| Comparative Example 1 | — | — | — | — | — | — | — | 14.7 | <0.001 | 8.0 | 100 | 0.014 |
| Comparative Example 2 | — | — | — | — | 350° C. | air | 8 hours | 14.3 | — | — | 92 | 0.006 |
| Comparative Example 3 | $F_2$ | 25° C. | $F_2$: 20% by volume | 8 hours | — | — | — | 14.5 | 0.7 | 8.0 | 101 | 0.006 |
| Comparative Example 4 | | 150° C. | $N_2$: 80% by volume | | — | — | — | 14.8 | 0.9 | 8.0 | 101 | 0.006 |
| Comparative Example 5 | | | | | 350° C. | air | 8 hours | 14.3 | 1.1 | 7.9 | 90 | 0.032 |
| Example 1 | | 250° C. | | | — | — | — | 14.4 | 2.5 | 7.8 | 99 | 0.002 |
| Example 2 | | 300° C. | | | — | — | — | 14.7 | 4.5 | 7.2 | 104 | 0.000 |
| Example 3 | | 350° C. | | | — | — | — | 14.8 | 8.2 | 6.4 | 104 | 0.001 |
| Example 4 | | 400° C. | | | — | — | — | 14.6 | 7.1 | 6.6 | 93 | 0.000 |
| Comparative Example 6 | | 500° C. | | | — | — | — | 14.4 | 8.5 | 6.6 | 35 | — |

As shown in Table 1, the fluorescent materials of Examples 1 to 3 each have a relative light emission intensity that is substantially equivalent to the fluorescent material of Comparative Example 1, and thus it is understood that the fluorescent material is not deteriorated through the contact with fluorine gas. The fluorescent materials of Examples 1 to 4 each exhibit a smaller change amount of chromaticity y (Δy) after storing under the environment of a temperature of 85° C. and a relative humidity of 85% for 500 hours than Comparative Example 1, and thus it is confirmed that the durability of the light emitting device is improved. It is considered that this is because in the fluorescent materials of Examples 1 to 4, the surface layer containing the fluorine-containing compound is formed on the surface or in the vicinity of the surface of the calcined product (fluorescent material core) by bringing the calcined product in contact with fluorine gas in the inert gas atmosphere and heat-treating in the inert gas atmosphere at the prescribed temperature. The surface layers of the fluorescent materials of Examples 1 to 4 function as a film that protects the fluorescent material core from the external environment, and thereby the fluorescent material core is prevented from being deteriorated under an environment having high temperature and high humidity. It is considered that the relative light emission intensity of the fluorescent material of Example 4 is slightly decreased as compared to the fluorescent material of Comparative Example 1 since the crystal structure of the calcined product (fluorescent material core) is changed by the high temperature for the contact of the calcined product and fluorine gas and the heat treatment therefor.

As shown in Table 1, the fluorescent materials of Examples 1 to 4 and the fluorescent materials of Comparative Examples 1 to 6 each have an average particle diameter of from 14.3 to 14.8 μm, from which it is confirmed that the average particle diameter is not largely changed by the heat treatment.

FIG. 4 is the SEM micrograph of the secondary electron image of the fluorescent material in Example 2, and FIG. 5 is the SEM micrograph of the secondary electron image of the fluorescent material in Comparative Example 1. It can be confirmed that there is no difference in appearance in the shape of the particles and the surface state of the particles between the fluorescent material of Example 2 shown in FIG. 4 and the fluorescent material of Comparative Example 1 shown in FIG. 5. It is understood that the heat treatment performed while bringing in contact with fluorine gas does not largely affect the shape of the particles and the surface state of the particles of the fluorescent material, based on the observation of the SEM micrograph of FIG. 4 and the SEM micrograph of FIG. 5.

As shown in the XRD patterns in FIG. 2, it is confirmed that the fluorescent materials of Comparative Examples 3, 4, and 6 and the fluorescent materials of Examples 1 to 4 each have a chlorosilicate composition represented by $Ca_{7.5}Eu_{0.5}MgSi_4O_{16}Cl_2$ of Comparative Example 1. These fluorescent materials each also have peaks that are characteristic to the compound represented by $Ca_8Mg(SiO_4)_4Cl_2$. The XRD patterns of the fluorescent materials of Examples 1 to 4 each have a sharp diffraction peak, from which it is expected that the fluorescent material has 50% by mass or more of a crystal phase. In particular, it is understood that the fluorescent materials of Examples 3 and 4 and Comparative Example 6 each have peaks that are characteristic to a compound $CaF_2$ appearing between 25° and 30°, and between 45° and 50°, of the diffraction angle (2θ) in the XRD patterns.

Figure 3:
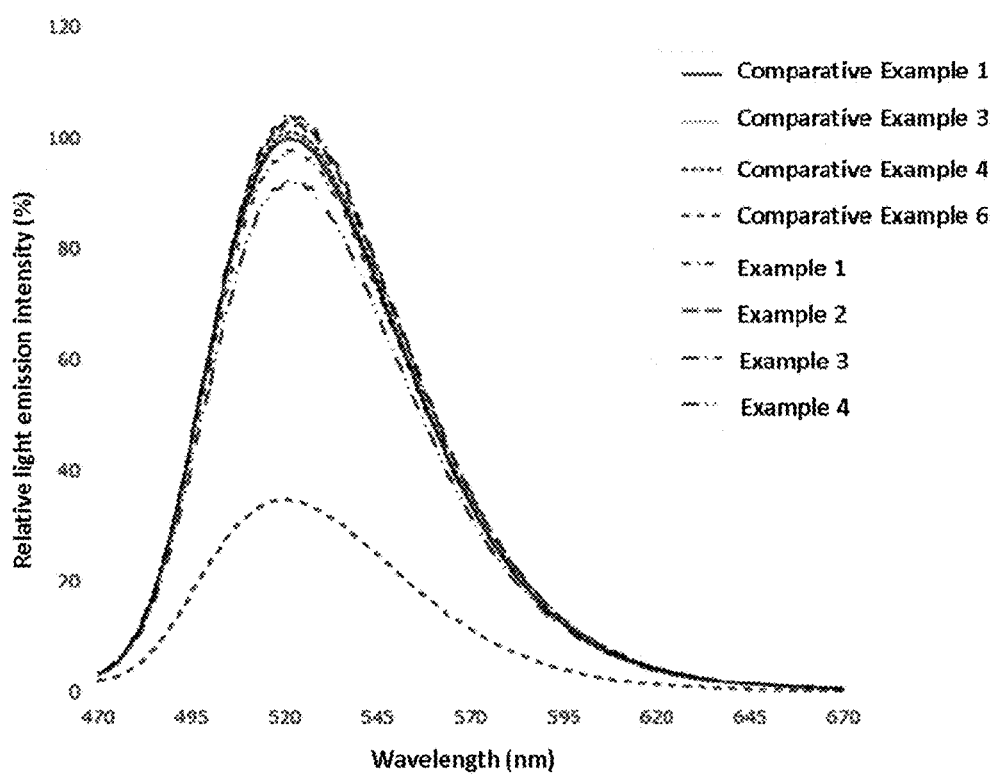
FIG. 3 is a diagram showing the light emission spectra the exemplary and comparative fluorescent materials.

As shown in FIG. 3, the light emission spectra of the relative light emission intensity with respect to the wavelength of the fluorescent materials of Examples 1 to 3 each retain a light emission intensity that is substantially equivalent to the light emission spectrum of the fluorescent material of Comparative Example 1. Furthermore, the peak shapes of the light emission spectra of the fluorescent materials of Examples 1 to 3 each have substantially no difference from the peak shape of the light emission spectrum of the fluorescent material of Comparative Example 1, from which it is expected that the crystal structure of the fluorescent material is not changed, and the crystal structure is stable, in the case where the heat treatment temperature is 250° C. or more and 400° C. or less. The light emission spectrum of the fluorescent material of Example 4 has a smaller light emission intensity than the light emission spectrum of the fluorescent material of Comparative Example 1, from which it is expected that the crystal structure is slightly changed in the case where the heat treatment temperature is 400° C. or more.

The fluorescent material of Comparative Example 6, which is obtained by bringing in contact with fluorine gas and heat-treating at 500° C., undergoes change in crystal structure due to the too high heat treatment temperature, and thereby the relative light emission intensity is considerably deteriorated as compared to the fluorescent material of Comparative Example 1.

The contact conditions of the calcined product and the fluorine-containing substance and the heat treatment conditions in Examples 5 to 7 and Comparative Example 7 are shown in Table 2. In Comparative Example 7, the calcined product was not in contact with a fluorine-containing substance, and a heat treatment was performed in a nitrogen gas atmosphere. The conditions thereof are shown in Table 2.

TABLE 2

| | Contact condition and heat treatment condition of fluorine-containing substance | | | | Average | | | Relative | Change |
|---|---|---|---|---|---|---|---|---|---|
| | Fluorine-containing compound | Amount added (% by mass) | Contact temperature | Atmosphere | Contact time | particle diameter (μm) | F content (% by mass) | Cl content (% by mass) | light emission intensity (%) | amount of chromaticity y Δy |
| Comparative Example 7 | — | — | 350° C. | N$_2$: 99.9% by volume | 8 hours | 14.6 | 0.0 | 8.1 | 91 | 0.029 |
| Example 5 | NH$_4$F | 5 | | | | 14.7 | 3.6 | 7.6 | 100 | 0.002 |
| Example 6 | | 10 | | | | 14.6 | 6.0 | 7.4 | 99 | 0.003 |
| Example 7 | | 20 | | | | 14.8 | 11.0 | 6.9 | 100 | 0.005 |

As shown in Table 1, the fluorescent material of Comparative Example 2, which is obtained by subjecting the fluorescent material to the heat treatment in the air at 350° C. without the contact with fluorine gas, has a smaller relative light emission intensity than the fluorescent material of Comparative Example 1, and also undergoes change in chromaticity y. The heat treatment in the air as in Comparative Example 2 does not form a surface layer on the surface of the calcined product, and the fluorescent material has deteriorated durability. The fluorescent material of Comparative Example 3 is obtained by bringing in contact with fluorine gas at 25° C., and the fluorescent material of Comparative Example 4 is obtained by bringing in contact with fluorine gas at 150° C. The fluorescent material of Comparative Example 3 and the fluorescent material of Comparative Example 4 each have a relative light emission intensity that is equivalent to the fluorescent material of Comparative Example 1, but undergo large change in chromaticity y and thus are not improved in durability.

The fluorescent material of Comparative Example 5, which is obtained by bringing in contact with fluorine gas at 150° C. and then heat-treating in the air at 350° C., is inferior in relative light emission intensity to the fluorescent material of Comparative Example 1, and undergoes the largest change in chromaticity y among the fluorescent materials of Comparative Examples 1 to 5, from which it is expected that the heat treatment in the air forms a layer containing an oxygen-containing compound on the surface of the calcined product or in the vicinity of the surface, instead of a surface layer containing a fluorine-containing compound, thereby deteriorating the durability.

As shown in Table 2, the fluorescent materials of Examples 5 to 7 are produced by bringing the calcined product in contact with ammonium fluoride and heat-treating in a nitrogen gas atmosphere as an inert gas atmosphere, and thereby undergo small change in chromaticity and retain the relative light emission intensity, as compared to Comparative Examples 1 and 7, and are largely improved in durability as compared to Comparative Example 7. In particular, the fluorescent materials of Examples 5 and 6 shown in Table 2 each have smaller change in chromaticity y than the fluorescent material of Comparative Example 7, and the change amount thereof is equivalent to Example 1 shown in Table 1. It is confirmed from the results shown in Table 2 that the fluorescent material obtained by bringing the calcined product in contact with ammonium fluoride and heat-treating is improved in durability, as similar to the fluorescent material obtained by bringing the calcined product in contact with fluorine gas and heat-treating.

The fluorescent material of Comparative Example 7 is obtained by heat-treating the calcined product in an inert gas atmosphere without the contact of the calcined product with ammonium fluoride, and thus the relative light emission intensity is lowered, the change amount of the chromaticity y is large, and the durability is deteriorated, as compared to Comparative Example 1.

TABLE 3

|  |  | Compositional ratio (molar ratio) | | | | | | |
|---|---|---|---|---|---|---|---|---|
|  |  | Ca | Eu | Mg | Si | O | Cl | F |
| Example 3-1 | Fluorescent material core 1a | 7.65 | 1.30 | 1.11 | 4.00 | 15.30 | 1.70 | 0.00 |
| (Fluorescent material particle 1) | Surface layer 1b | 8.16 | 1.10 | 0.94 | 4.00 | 10.50 | 0.80 | 8.60 |
| Example 3-2 | Fluorescent material core 2a | 7.15 | 1.10 | 1.05 | 4.00 | 14.60 | 1.80 | 0.00 |
| (Fluorescent material particle 2) | Surface layer 2b | 7.58 | 1.10 | 1.01 | 4.00 | 14.80 | 1.90 | 0.90 |
| Example 6-1 | Fluorescent material core 3a | 7.58 | 1.20 | 1.06 | 4.00 | 15.80 | 2.00 | 0.00 |
| (Fluorescent material particle 3) | Surface layer 3b | 4.79 | 1.30 | 0.65 | 4.00 | 10.00 | 0.80 | 8.00 |
| Comparative Example 1-1 | Fluorescent material core 4a | 7.36 | 1.00 | 1.02 | 4.00 | 15.60 | 1.80 | 0.00 |
| (Fluorescent material particle 4) | Surface portion of fluorescent material 4b | 6.78 | 1.10 | 1.04 | 4.00 | 19.60 | 1.60 | 0.00 |

As shown in Table 3, the fluorescent material core 1a of the fluorescent material particle 1 of Example 3-1, the fluorescent material core 2a of the fluorescent material particle 2 of Example 3-2 (as shown in FIG. 6), and the fluorescent material core 3a of the fluorescent material particle 3 of Example 6-1 (as shown in FIG. 7) each do not contain fluorine, and have a composition represented by the formula (I). The surface layer 1b of Example 3-1, the surface layer 2b of Example 3-2, and the surface layer 3b of Example 6-1 each contain fluorine.

The center portion (fluorescent material core) 4a of the fluorescent material particle of Comparative Example 1-1 (as shown in FIG. 8) does not contain fluorine, and has a composition represented by the formula (I). However, the surface portion 4b of the fluorescent material particle 4 of Comparative Example 1-1 does not contain fluorine, a small amount of calcium (Ca), and a large amount of oxygen (O), from which it is expected that the surface of the fluorescent material is oxidized.

As shown in the SEM micrograph in FIG. 6, the fluorescent material particle 1 of Example 3-1 contains the fluorescent material core 1a and the surface layer 1b. As shown in the SEM micrograph in FIG. 6, the surface layer 1b has a difference in color density from the fluorescent material core 1a, from which it is confirmed that the surface layer 1b is formed on the surface of the fluorescent material core 1a. The fluorescent material particle 1 of Example 3-1 has the surface layer 1b having a substantially uniform thickness on the surface of the fluorescent material core 1a over the portion shown in the SEM micrograph. The fluorescent material particle 2 of Example 3-2 also contains the fluorescent material core 2a and the surface layer 2b. The thickness of the surface layer 1b of the fluorescent material particle 1 of Example 3-1 is larger than the thickness of the surface layer 2b of the fluorescent material particle 2 of Example 3-2. It is considered that this is because the reaction of the fluorescent material core 1a with fluorine in the fluorescent material particle 1 of Example 3-1 is further facilitated as compared to the fluorescent material particle 2 of Example 3-2. As shown in the SEM micrograph in FIG. 6, the thickness of the surface layer 1b of the fluorescent material particle 1 of Example 3-1 is approximately from 0.2 µm to 0.3 µm, and the thickness of the surface layer 2b of the fluorescent material particle 2 of Example 3-2 is approximately 0.05 µm.

As shown in the SEM micrograph in FIG. 7, the fluorescent material particle 3 of Example 6-1 contains the fluorescent material core 3a and the surface layer 3b. As shown in the SEM micrograph in FIG. 7, the surface layer 3b has a difference in color density from the fluorescent material core 3a, from which it is confirmed that the surface layer 3b is formed on the surface of the fluorescent material core 3a.

The fluorescent material particle 3 of Example 6-1 has the surface layer 3b having a substantially uniform thickness on the surface of the fluorescent material core 3a over the portion shown in the SEM micrograph. The thickness of the surface layer 3b of the fluorescent material particle 3 of Example 6-1 is approximately from 0.2 µm to 0.4 µm.

As shown in the SEM micrograph in FIG. 8, the fluorescent material particle 4 of Comparative Example 1-1 has no difference in color density between the fluorescent material core 4a (i.e., the center portion of the fluorescent material) and the surface portion 4b of the fluorescent material, and thus has no surface layer.

The fluorescent material according to the aspects of the present disclosure can be used in a light emitting device, and the light emitting device according to the aspects of the present disclosure has excellent durability and can be favorably applied to a light source for illumination. In particular, the fluorescent material and the light emitting device can be favorably applied to an illumination light source significantly excellent in light emission characteristics having a light emitting diode as an excitation light source, an LED display device, a backlight source for a liquid crystal display device, a traffic signal, a lighting switch, various sensors, various indicators, a small sized strobe, and the like.

Although the present disclosure has been described with reference to several exemplary embodiments, it shall be understood that the words that have been used are words of description and illustration, rather than words of limitation. Changes may be made within the purview of the appended claims, as presently stated and as amended, without departing from the scope and spirit of the disclosure in its aspects. Although the disclosure has been described with reference to particular examples, means, and embodiments, the disclosure may be not intended to be limited to the particulars disclosed; rather the disclosure extends to all functionally equivalent structures, methods, and uses such as are within the scope of the appended claims.

One or more examples or embodiments of the disclosure may be referred to herein, individually and/or collectively, by the term "disclosure" merely for convenience and without intending to voluntarily limit the scope of this application to any particular disclosure or inventive concept. Moreover, although specific examples and embodiments have been illustrated and described herein, it should be appreciated that any subsequent arrangement designed to achieve the same or similar purpose may be substituted for the specific examples or embodiments shown. This disclosure may be intended to cover any and all subsequent adaptations or variations of various examples and embodiments. Combinations of the above examples and embodiments, and other examples and embodiments not specifically described herein, will be apparent to those of skill in the art upon reviewing the description.

In addition, in the foregoing Detailed Description, various features may be grouped together or described in a single embodiment for the purpose of streamlining the disclosure. This disclosure may be not to be interpreted as reflecting an intention that the claimed embodiments require more features than are expressly recited in each claim. Rather, as the following claims reflect, inventive subject matter may be directed to less than all of the features of any of the disclosed embodiments. Thus, the following claims are incorporated into the Detailed Description, with each claim standing on its own as defining separately claimed subject matter.

The above disclosed subject matter shall be considered illustrative, and not restrictive, and the appended claims are intended to cover all such modifications, enhancements, and other embodiments which fall within the true spirit and scope of the present disclosure. Thus, to the maximum extent allowed by law, the scope of the present disclosure may be determined by the broadest permissible interpretation of the following claims and their equivalents, and shall not be restricted or limited by the foregoing detailed description.

What is claimed is:

1. A method of producing a fluorescent material, comprising:
   preparing a calcined product having a chlorosilicate composition containing at least one element selected from the group consisting of Ca, Sr, and Ba, at least one element selected from the group consisting of Mg and Zn, at least one element selected from the group consisting of Eu, Ce, Tb, and Mn, Si, O, and Cl; and
   bringing the calcined product in contact with a fluorine-containing substance and heat-treating the calcined product in an inert gas atmosphere at a temperature in a range of 200° C. or more and 450° C. or less.

2. The method of producing a fluorescent material according to claim 1, wherein the temperature for the heat treatment is more than 250° C. and less than 400° C.

3. The method of producing a fluorescent material according to claim 1, wherein the calcined product has a composition represented by the following formula (I):

$$M^a{}_v Eu_w M^b{}_x Si_4 O_y Cl_z \qquad (I)$$

wherein $M^a$ represents at least one element selected from the group consisting of Ca, Sr, and Ba; $M^b$ represents at least one element selected from the group consisting of Mg and Zn; and v, w, x, y, and z each are numbers satisfying $6.5 \leq v \leq 8.0$, $0.01 \leq w \leq 2.0$, $0.8 \leq x \leq 1.2$, $14.0 \leq y \leq 18.0$, and $1.0 \leq z \leq 2.0$.

4. The method of producing a fluorescent material according to claim 1, wherein the fluorine-containing substance is at least one of $F_2$ and $NH_4F$.

5. A fluorescent material comprising:
   a fluorescent material core having a chlorosilicate composition containing at least one element selected from the group consisting of Ca, Sr, and Ba, at least one element selected from the group consisting of Mg and Zn, at least one element selected from the group consisting of Eu, Ce, Tb, and Mn, Si, O, and Cl; and
   a surface layer containing a fluorine-containing compound, and
   wherein the fluorine-containing compound has a composition containing a portion of the at least one element selected from the group consisting of Ca, Sr, and Ba, the at least one element selected from the group consisting of Mg and Zn, the at least one element selected from the group consisting of Eu, Ce, Tb, and Mn, Si, O, and Cl, which are contained in the composition of the fluorescent material core, and further containing F.

6. The fluorescent material according to claim 5, wherein the surface layer containing a fluorine-containing compound has a thickness in a range of 0.05 μm or more and 0.8 μm or less.

7. The fluorescent material according to claim 5, wherein the fluorescent material core has a composition represented by the following formula (I):

$$M^a{}_v Eu_w M^b{}_x Si_4 O_y Cl_z \qquad (I)$$

wherein $M^a$ represents at least one element selected from the group consisting of Ca, Sr, and Ba; $M^b$ represents at least one element selected from the group consisting of Mg and Zn; and v, w, x, y, and z each are numbers satisfying $6.5 \leq v \leq 8.0$, $0.01 \leq w \leq 2.0$, $0.8 \leq x \leq 1.2$, $14.0 \leq y \leq 18.0$, and $1.0 \leq z \leq 2.0$.

8. A light emitting device comprising the fluorescent material according to claim 5 and an excitation light source.

* * * * *